United States Patent [19]

Palara

[11] Patent Number: 5,408,124

[45] Date of Patent: Apr. 18, 1995

[54] MONOLITHIC SEMICONDUCTOR DEVICE HAVING A VERTICAL STRUCTURE WITH A DEEP-BASE AND FINGER-EMITTER POWER TRANSISTOR HAVING A BALLAST RESISTANCE

[75] Inventor: Sergio Palara, Acicastello, Italy

[73] Assignee: Consorzio Per La Ricerca Sulla Microelettronica Nel Mezzogiorno, Catania, Italy

[21] Appl. No.: 982,081

[22] Filed: Nov. 25, 1992

[30] Foreign Application Priority Data

Nov. 26, 1991 [IT] Italy ............................ MI91A03159

[51] Int. Cl.⁶ .............................................. H01L 29/72
[52] U.S. Cl. ................................... 257/580; 257/164; 257/582; 257/591
[58] Field of Search ................ 257/164, 580, 582, 591

[56] References Cited

U.S. PATENT DOCUMENTS

| | | | |
|---|---|---|---|
| 4,072,979 | 2/1978 | Palara | 257/580 |
| 4,506,208 | 3/1985 | Merrill | 357/36 |
| 4,769,688 | 9/1988 | Cotton | 257/580 |

FOREIGN PATENT DOCUMENTS

| | | |
|---|---|---|
| 0322040 | 6/1989 | European Pat. Off. . |
| 57-034357 | 2/1982 | Japan . |
| 3069123 | 3/1991 | Japan . |

*Primary Examiner*—Edward Wojciechowicz
*Attorney, Agent, or Firm*—Robert Groover; Betty Formby

[57] ABSTRACT

A finger-emitter power transistor including a substrate suitable for operating as the collector of the power transistor, an epitaxial layer superimposed over the substrate (and providing a base region for the transistor), and at least one buried emitter region (for each finger of the device) below the surface of the epitaxial layer. Each buried emitter region is provided with at least one connection area to an emitter surface metallization. The connection areas between the emitter regions and their emitter surface metallization are made in various widths to provide a ballast resistance of an adequate value.

28 Claims, 6 Drawing Sheets

MONOLITHIC SEMICONDUCTOR DEVICE HAVING A VERTICAL STRUCTURE WITH A DEEP-BASE AND FINGER-EMITTER POWER TRANSISTOR HAVING A BALLAST RESISTANCE

BACKGROUND AND SUMMARY OF THE INVENTION

The present invention relates to a monolithic semiconductor device having a vertical structure with deep-base and finger-emitter power transistor having a ballast resistance.

Discrete power devices commonly use vertical-current-flow transistors to control large currents with low on-state resistance, while withstanding fairly large voltages. A large variety of device technologies have been proposed for such transistors, including MOS, bipolar, and various hybrids thereof. However, such vertical transistors are inherently difficult to integrate with high density, and may be hard to isolate.

"Smart Power" Integrated Circuits

A large amount of effort has been devoted to integrating high-density small-signal devices on a single integrated circuit with power devices. Such integrated circuits are commonly referred to as "smart power" circuits. However, the incompatibilities between vertical and planar processes have caused many difficulties in achieving such integration.[1]

[1] Some general review of this class of integrated circuits can be found in Wrathall et al., "Integrated Circuits for the Control of High Power," 1983 *IEDM Technical Digest*, paper no. 16.1, at pp. 408 ff, which is hereby incorporated by reference, and in Baliga, "An overview of smart power technology," 38 IEEE TRANSACTIONS ON ELECTRON DEVICES 1568 (1991), and references cited therein, all of which are hereby incorporated by reference. Reference is also made to Berta et al., "A simplified low-voltage smart power technology," 12 IEEE ELECTRON DEVICE LETTERS 465 (1991).

Such integrated circuits are desirable for many applications, including but not limited to linear voltage regulators, switching voltage regulators, AC motor control, fluorescent light ballasts, automotive controls, etc.

Normal Bipolar Device Structures

Bipolar devices are normally fabricated with a heavily doped n-type emitter region near the surface of the wafer, a thin p-type base region beneath the emitter region, and a large n-type collector region below the base region. (The base region is contacted through a P+ base contact region which is laterally separated from the emitter region, and the collector region is contacted by a front or backside contact which may be widely separated from the emitter contact.) In this device architecture, the thickness of the base region is equal to the difference between the depth of the emitter-base junction and the depth of the base-collector junction. Since both of these junction depths are dependent on diffusion lengths, the process parameters can be controlled to yield a very small base thickness—smaller than could directly be achieved by photolithographic methods. Reduction in the base thickness tends to increase the device gain, and hence is desirable up to a point. However, extreme reduction in the base thickness will also decrease the breakdown voltage of the device.

Some early experimentation used bipolar devices with lateral current flow, and some efforts to provide a complementary bipolar process have used bipolar devices with lateral current flow. However, in general, device architectures with essentially vertical current flow have been greatly preferred for integrated circuits which include bipolar devices.

A vertical structure technology, also known as VIPOWER, has been used for the integration on the same silicon chip of a power transistor and of a control circuit. A process for the manufacture of a structure of thus type is described, for example, in U.S. Pat. No. 4,965,215, entitled "Manufacturing process for a monolithic semiconductor device comprising at least one transistor of an integrated control circuit and one power transistor integrated on the same chip," (corresponding to Italian patent application No. 6630 A/87 filed on 22 Dec. 1987 in the name of SGS-THOMSON MICROELECTRONICS s.r.l.), both of which are hereby incorporated by reference.

In its more general form a VIPOWER structure is formed by a semiconductor substrate of a first conductivity type over which there is superimposed an epitaxial layer of the same conductivity type.

In the epitaxial layer are formed not only the power transistor (which will be emphasized in the following discussion), but also control transistors which (with their interconnects) embody the corresponding control circuit.

The control transistors are contained entirely in isolation regions formed in the epitaxial layer. These regions have a second conductivity type and are provided with regions of surface connection. Inside the isolation regions there are buried layers suitable for constituting collector regions of the control transistors. The buried layers are formed of the first conductivity type and are provided with surface regions of enrichment. The collector region of each control transistor is thus in the shape of an L and contains base and emitter regions of the transistor itself formed one inside the other, of the first and of the second conductivity type, respectively.

In the epitaxial layer there is also the base region of the power transistor. This is formed of the second conductivity type and is provided with regions of surface connection. The base region of the power transistor is suitable for circumscribing laterally and for containing in depth the emitter region of the power transistor. It has the first conductivity type and is provided with a region of surface enrichment. The collector of the power transistor coincides with the substrate.

Instead of a single emitter region a power transistor of the type described above can comprise several emitter regions or fingers connected together and wholly contained within the base region of the transistor itself. In both cases we have a deep-base power transistor.

In its embodiment with a finger-emitter, the fingers of the emitter are in part buried in the base region and are provided with connection areas at the surface of the chip. The connection areas are regions with a low resistivity suitable for conveying the current toward the surface where it is collected through a metallization according to the known art described, for example, in the abovementioned patent application.

In order to provide the power transistor with a good margin of safety against secondary breakdown ("safe operating area"), the emitter fingers of the power transistor should be fairly wide so that the ballast resistances that are formed in the connection areas between the emitter contact areas and the fingers themselves allow a good balance of the currents in the various fingers of the emitter.

At high currents the current rating of the transistor is a function of the perimeter of the emitter facing the base region, not of the area of the emitter. In order to maximize current, with transistors of a given size, it is necessary to reduce the size of the fingers and to increase their number so as to increase the perimeter of the emitter itself.

This detracts from the objective of a good safe operating area, since by decreasing the width of the connection areas of the fingers there is no more ballast, i.e. a certain series resistance, for each finger, which makes for a uniform distribution of current among the different fingers of the power transistor.

The object of the present invention is to allow the fabrication of a monolithic device with a deep-base and finger-emitter power transistor which, while still operating with high currents and having a limited size, has a uniform distribution of current in the various fingers of the emitter.

According to the invention such object is attained through a monolithic semi-conductor device having a vertical structure with a deep-base and finger-emitter power transistor, comprising a substrate of a first conductivity type suitable for operating as the collector of the power transistor, an epitaxial layer of said first conductivity type superimposed over said substrate, a base region of a second conductivity type formed in said epitaxial layer, at least one emitter region in buried layer for each emitter finger provided with at least one connection area between it and an emitter surface metallization, an emitter contact connected to the emitter surface metallization of all the fingers and base surface metallizations, wherein said at least one connection area is made of a width such as to provide a ballast resistance of an adequate value between said at least one emitter region in buried layer and the corresponding emitter surface metallization.

The preferred embodiment provides a finger-emitter power transistor including a substrate suitable for operating as the collector of the power transistor, an epitaxial layer superimposed over the substrate (and providing a base region for the transistor), and at least one buried emitter region (for each finger of the device) below the surface of the epitaxial layer. Each buried emitter region is provided with at least one connection area to an emitter surface metallization. The connection areas between the emitter regions and their emitter surface metallization are made in various widths to provide a ballast resistance of an adequate value.

In this way the advantage is obtained of being able to make an emitter with a high perimeter and thus in a position of operating with high currents even with a limited size, without reducing the series resistance of each finger of the emitter, that is the ballast resistance, below the value required for making the current distribution uniform in the different fingers of the power transistor.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
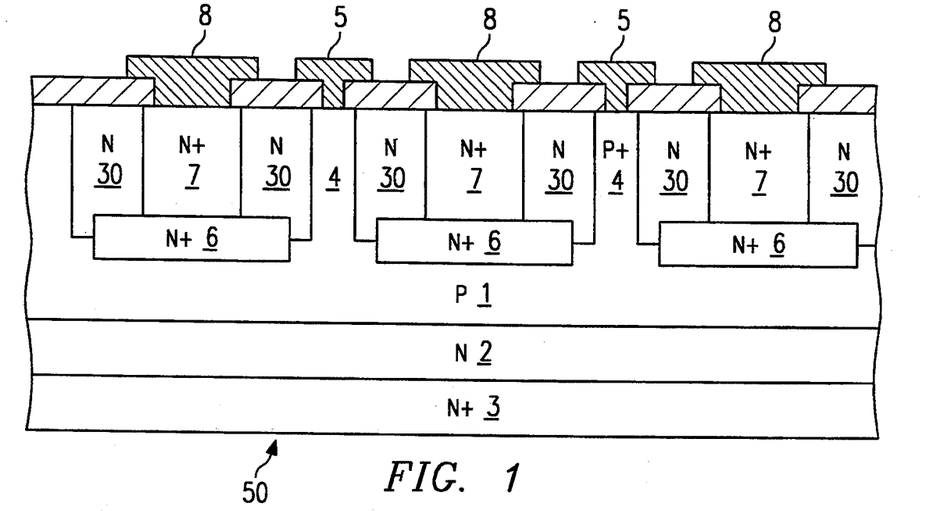
FIG. 1 is a view in a vertical cross-section of a power transistor having a vertical structure according to the known art.

With reference to FIG. 1, a semiconductor power transistor having a vertical structure according to the known art comprises, on a monolithic chip 50, a substrate 3 of the type N+ suitable for operating as the collector of the transistor itself, an epitaxial layer 2 of the type N superimposed over the substrate and a base region 1 of the type P formed inside the epitaxial layer 2. The base region 1 extends along the surface, with P+ vertical connection regions 4 being contacted by means of base metallization leads 5.

Inside the base region 1 there are emitter regions 6 of the type N+, each constituting a finger of a finger-emitter of the transistor, deeply buried in the base region 1, circumscribed laterally by a second epitaxial layer 30 of the type N, and provided with respective vertical areas 7 of the type N+ for their low resistivity connection to the surface of the chip 50.

The connection areas 7 are suitable for being contacted by means of emitter surface metallizations 8. The metallizations 8 of the different areas 7 come together in a known way at a common contact suitable for constituting the contact of the finger-emitter of the power transistor.

In the prior-art structure of FIG. 1, the width of region 7 is usually about 0.9 times that of region 6.

As already said in the introduction, with the object of having a power transistor of limited size that operates with high currents and with a balancing of the currents in the emitter fingers, it is necessary to increase as much as possible the perimeter of the emitter, and thus of each finger of the same emitter, that is, of the individual emitter regions 6 contained in the base region 1, without reducing the so-called ballast resistances which allow the balancing of the currents in the different emitter regions 6.

Figure 2:
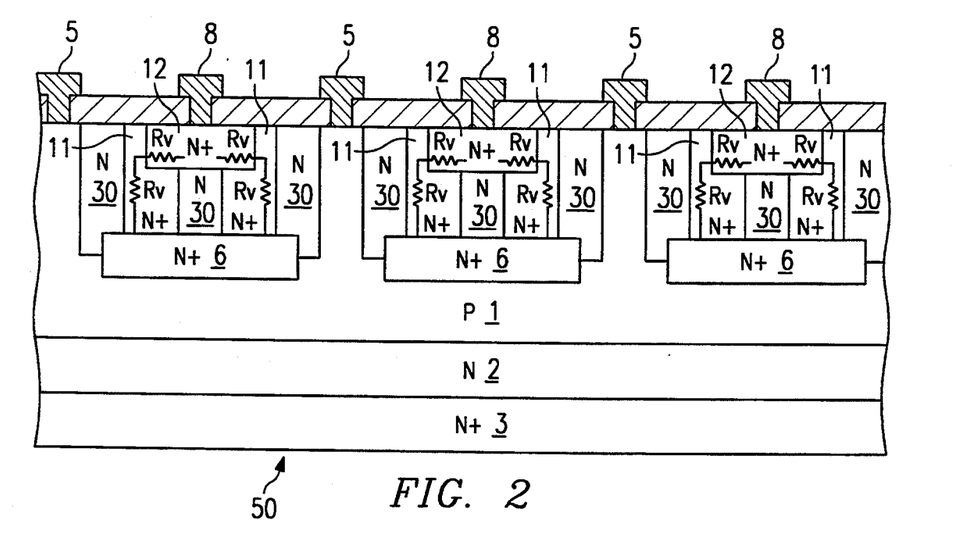
FIG. 2 is a similar view in a vertical cross-section of a first embodiment of a power transistor having a vertical structure according to the present invention.

This is obtained, according to the first embodiment of the invention illustrated in FIG. 2, by replacing each vertical connection area 7 with a pair of vertical connection areas 11 connected at the surface by a horizontal connection area 12 of the type N+ of a length such as to allow the opening of emitter contact.

In this way a parallel resistance is created, constituting a ballast resistance Rv, which starting from the metallization 8 corresponding to a respective emitter region 6 runs parallel to the surface along a semi-region of horizontal connection 12 and then in depth along a corresponding vertical connection area 11.

With this structure, by having the vertical connection areas 11 of a sufficiently narrow size, it is possible to obtain a number of emitter fingers that is higher than standard by increasing the perimeter of the emitter, but maintaining the balance of the currents in the fingers.

The maximum emitter perimeter is obtained, as is obvious, with fingers, and thus emitter regions 6, that are particularly narrow. For this purpose it is possible to use instead of the pair of vertical connection areas 11, corresponding to an emitter region 6, a single vertical connection area 14 having a suitably-selected narrow width.

Figure 3:
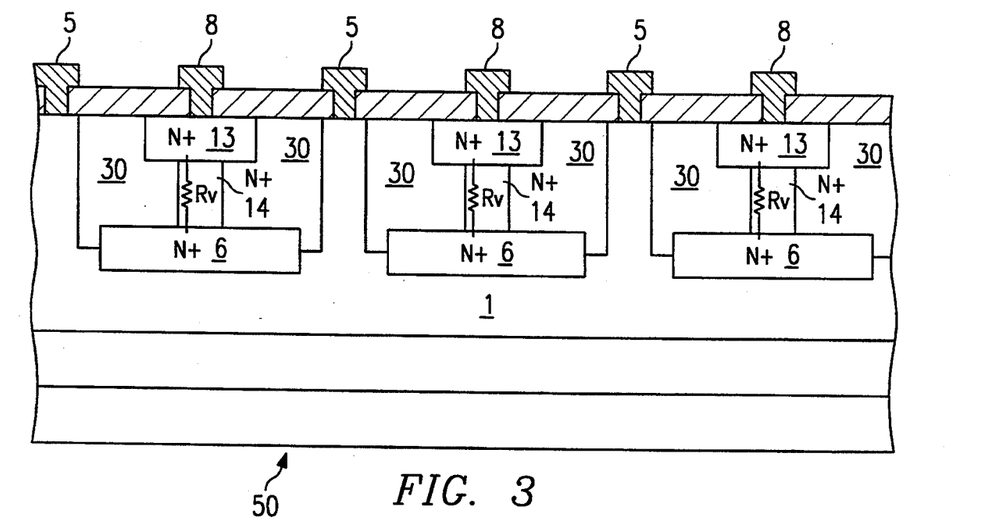
FIG. 3 is a similar view in a vertical cross-section of a variant of the embodiment of FIG. 2 of the power transistor having a vertical. structure according to the invention.

A variant is thus obtained, illustrated in FIG. 3, of the embodiment of FIG. 2.

Instead of the horizontal connection region 12 between the pairs of vertical connection areas 11, related to an emitter region 6, there is here a contact region 13 of the type N+ whose width is such as to allow a sufficiently wide opening of emitter contact.

According to this embodiment, for each vertical connection area 14 there is a ballast resistance Rv of an adequate value, function of the width of the area 14 and of its doping, interposed between the metallization 8 of the corresponding emitter region 6 and the central area of the same emitter region 6. (A sample width for the area 14 would be 10 microns, at a doping level of $10^{18}$ atoms $cm^{-3}$.)

The presence of the contact region 13 is indispensable in the case wherein the corresponding vertical connection region 14 has a very small width, of the order of 10 microns. In this case in fact the emitter contact would be narrower than 10 microns and too high a current density could damage the area of contact between the silicon and the metallization 8.

Figure 4:
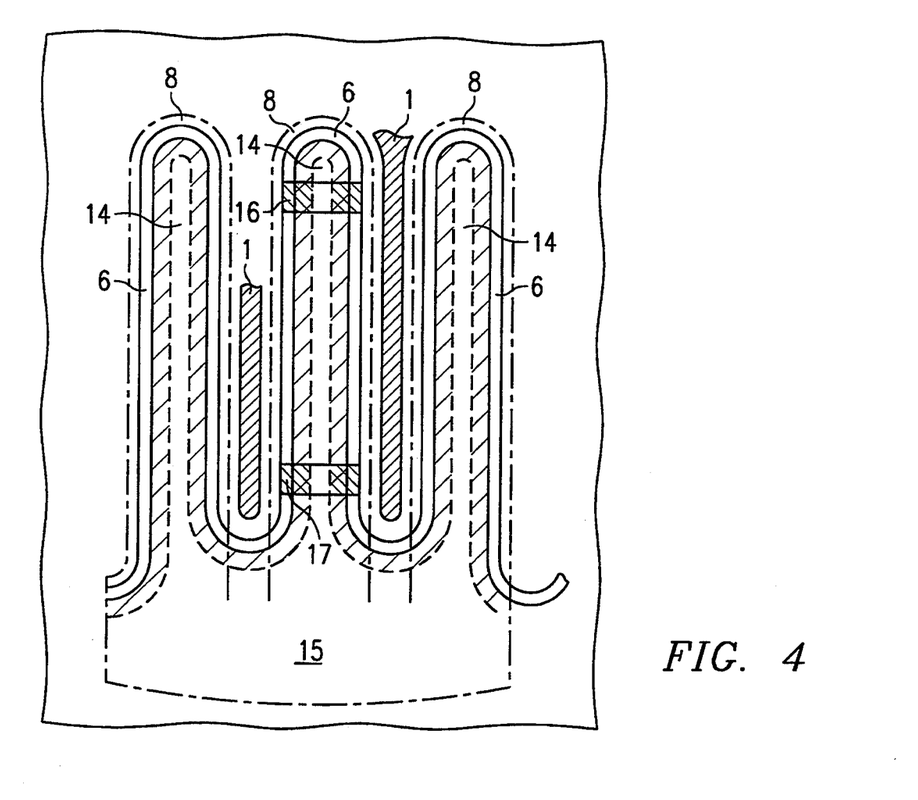
FIG. 4 is a plan view of the emitter of the power transistor of FIG. 3.

A plan view of FIG. 3 from above is illustrated in FIG. 4.

In this Figure it is possible to see the structure with fingers, three in the drawing, represented by the different emitter regions 6, immersed in the base region 1, and by the corresponding metallizations 8 connected to the emitter contact indicated with dotted lines with the numerical reference 15. The connection areas 14 are also indicated with dotted lines.

The same figure may be used as a plan view from above of FIG. 2 by replacing each connection area 14 with the pair of connection areas 11.

Considering just one emitter finger, say the middle one of FIG. 4, the corresponding emitter region 6 is divisible into adjacent portions that can be considered similar from a circuit viewpoint to transistors having a common base. FIG. 4 indicates portions 16, 17 which correspond in the circuit diagram of FIG. 5 to respective transistors T16, T17.

Figure 5:
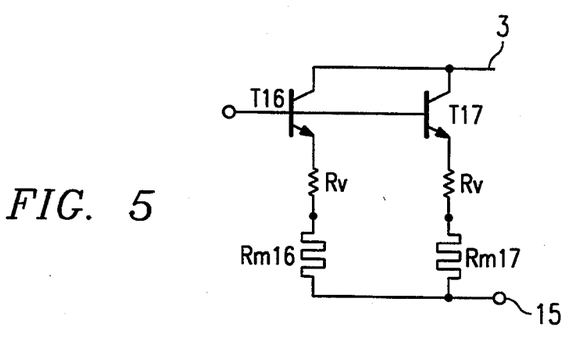
FIG. 5 is an equivalent circuit diagram of portions of an emitter finger.
Figure 6:
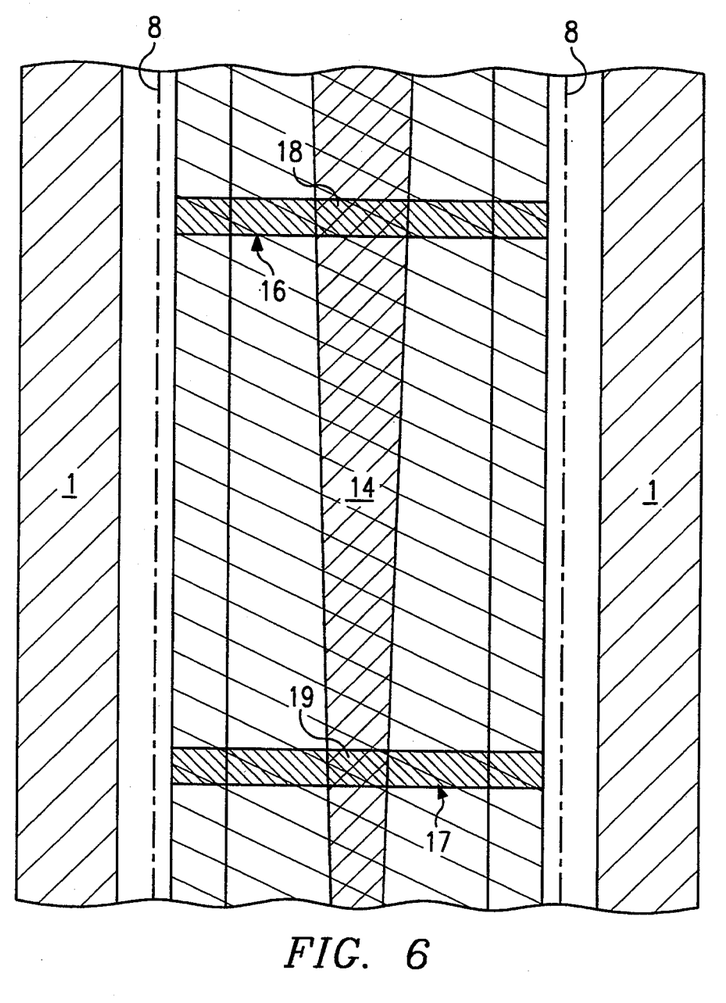
FIG. 6 is a plan view from above of an emitter finger according to a variant with respect to FIG. 4.

The generic portions 16, 17 have the same ballast resistance Rv, or vertical resistance, but different metallization resistance, since they are positioned at different points of the metallization 8 and in particular at a different distance, calculated in a direction parallel to the surface of the chip 50, from the emitter contact 15. For a thickness of 3 microns the metallization resistance can be calculated at some 10 milliohm per square.

Indicating with Rm16 and Rm17 the metallization resistances of the transistors T16, T17, Rm16 is greater than Rm17.

If we consider that the emitter current rises linearly from one extremity of a generic emitter finger toward the contact 15, it can be deduced that the voltage drop between the portions 16 and 17 becomes very substantial, of the order of hundreds of millivolts, thus de-biasing the portion 16 of the emitter region 6 with respect to the portion 17. As is obvious, this is true provided the ballast resistances Rv are not so large as to make the voltage drops negligible on the portions of metallization 8 interposed between the portions 16, 17 and the contact 15.

In order to overcome this drawback it is possible to choose to make the connection area 14, in the case of FIG. 3, or in altogether similar manner the connection areas 11 in the case of FIG. 2, with a variable width so as to have ballast resistances Rv that are differentiated for the different portions 16, 17 of a corresponding emitter region 6. In this way a greater metallization resistance Rm16, as in the case of the portion 16, shall correspond to a smaller ballast resistance Rv and thus a wider portion 18 of the connection area 14, and vice versa a smaller metallization resistance Rm17, as in the case of portion 17, shall correspond to a greater ballast resistance Rv, thus a narrower portion 19 of the connection area 14.

Other specific parameters, in an exemplary embodiment of a 1000-V transistor according to FIGS. 3 and 4, are as follows. (However, of course, these specific values can be widely modified and varied, as will be readily apparent to those of ordinary skill in the art.)

Boundary between N+ region 13 and N-type region 30: $\approx 3$ $\mu$m deep;

Boundary between N-type region 30 and N+ region 6: $\approx 6$ $\mu$m deep;

Junction between N+ region 6 and P-type region 1: $\approx 13$ $\mu$m deep;

Junction between P-type region 1 and N-type region 2: $\approx 20$ $\mu$m deep;

Boundary between N-type region 2 and N+ substrate 3: $\approx 50$ $\mu$m deep. (The resulting effective vertical length of region 14 would be $\approx 3$ $\mu$m.)

Doping of N-type region 2: 7E13 $cm^{-3}$.
Doping of P-type region 1: 1.2E14 $cm^{-3}$.
Doping of N+ region 6: 8E16 $cm^{-3}$.
Doping of N-type region 14: 2E19 $cm^{-3}$.
Doping of N+ region 13: 2E19 $cm^{-3}$.
Doping of N-type region 30: 7E13 $cm^{-3}$.
Implantations into region 30, to form region 14, include:
   5E15 $cm^{-2}$ of B at 80 KeV (also forming region 4);
   2.8E15 $cm^{-2}$ of Sb at 60 KeV (also forming region 6);

Deposition and drive of Phosphorus (forming region 13);

Deposition and drive of Phosphorus (forming region 14).

In devices with a voltage rating of (for example) 1000V: The magnitude of TOTAL emitter series resistance is typically on the order of 100 m$\Omega$. The $\pm$ tolerance on TOTAL series resistance is typically $\pm 15\%$. The contact resistance, in the presently preferred embodiment, is insignificant in comparison to the other resistances.

In the layout of FIG. 4, the width of each emitter finger is 200–250$\mu$ in the presently preferred embodiment, and the length is 10 times the width.

According to this embodiment, for each vertical connection area 14 there is a ballast resistance Rv of an adequate value, function of the width of the area 14 and of its doping, interposed between the metallization 8 of the corresponding emitter region 6 and the central area of the same emitter region 6. (A sample width for the area 14 would be 10 microns, at a doping level of $10^{18}$ atoms cm$^{-3}$.)

A power transistor of the hollow type can also benefit from the introduction of connection areas of the emitter regions to the corresponding metallizations, which have balancing resistances of the currents flowing in the different fingers of the emitter.

Figure 7:
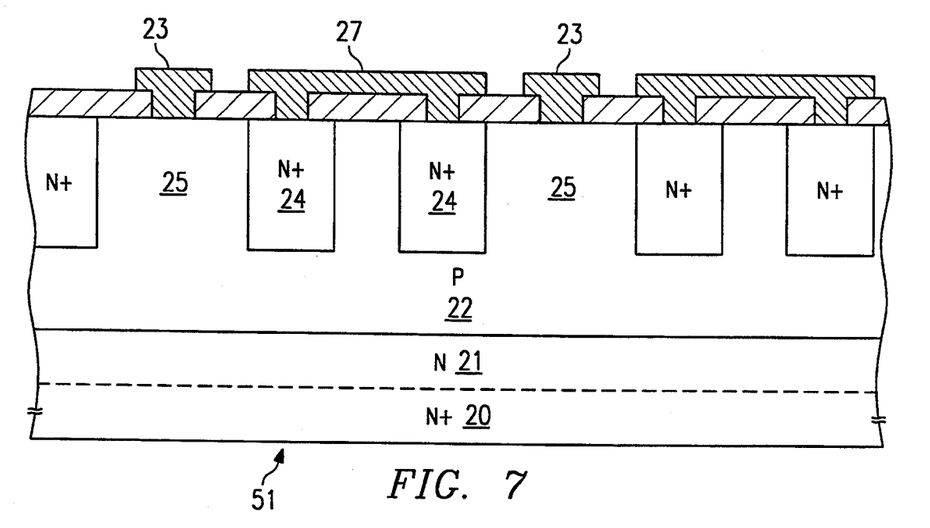
FIG. 7 is a vertical cross-section of a power transistor having a vertical structure of the hollow emitter type according to the known art.

A vertical structure power transistor of the hollow emitter type according to the known art is shown in FIG. 7.

According to such known art a hollow emitter power transistor with a standard structure comprises, in a monolithic chip 51, a substrate 20 of the type N+ suitable for operating as the collector of the power transistor, an epitaxial layer 21 of the type N, a base region 22 of the type P formed inside the epitaxial layer 21. The base region 22 extends along the surface with vertical connection areas 25 of the type P suitable for being contacted by means of base metallizations 23.

Inside the base region 22 there are emitter regions 24 of the type N+, two for each emitter finger. The emitter regions 24 of each finger are suitable for being contacted at the surface by a respective emitter metallization 27.

The set of metallizations 27 comes together in a known manner at a common contact suitable for constituting the contact of the finger-emitter of the hollow emitter power transistor.

Figure 8:
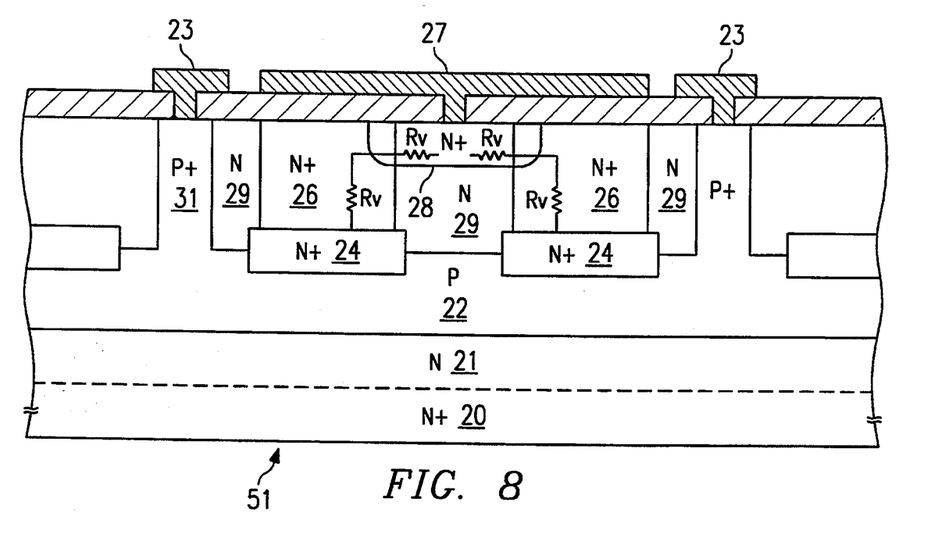
FIG. 8 is a vertical cross-section of a hollow emitter power transistor with deep emitter regions according to the present invention.

Starting with the standard structure of FIG. 7, a hollow emitter power transistor according to the invention may be formed in the deep-base structure of FIG. 8.

The structure of FIG. 8 differs from that of FIG. 7 in that the pair of emitter regions 24 of each finger is buried in depth in the base region 22, circumscribed laterally by a second epitaxial layer 29 of the type N, and is provided with a respective pair of vertical areas 26 of the type N+ for the connection of each pair of emitter regions 24 to the corresponding metallization 27. This connection is made with the interposition of a connection area 28 of the type N+ suitable for connecting at the surface the connection areas 26 and have a length such as to allow a suitable opening of emitter contact.

Moreover, instead of the vertical connection areas 25 of the type P there are similar regions 31 of the type P+.

The resulting structure is functionally similar to the first embodiment of a power transistor having a vertical structure and is structurally similar to its embodiment of FIG. 2 with the exception of the presence of a pair of emitter regions 24 for each finger instead of the single region 6.

This fact, however, does not introduce any change to the considerations on the balancing of the currents in the emitter fingers.

In a manner altogether similar to what has been seen for FIG. 2 a resistive parallel is created, constituting a ballast resistance Rv, which starting from the metallization 27 corresponding to the pair of emitter regions 24 of a finger runs parallel to the surface along a semi-region of the horizontal connection region 28 and thus in depth along the corresponding vertical connection area 26.

In this case it is also possible to make the connection regions 26 with a variable width so as to balance the different metallization resistances of portions of the emitter regions 24 positioned at a different surface distance with respect to the contact common to the different emitter metallizations 27.

In the case of a hollow emitter power transistor it is also possible to provide for particularly narrow emitter regions 24.

Figure 9:
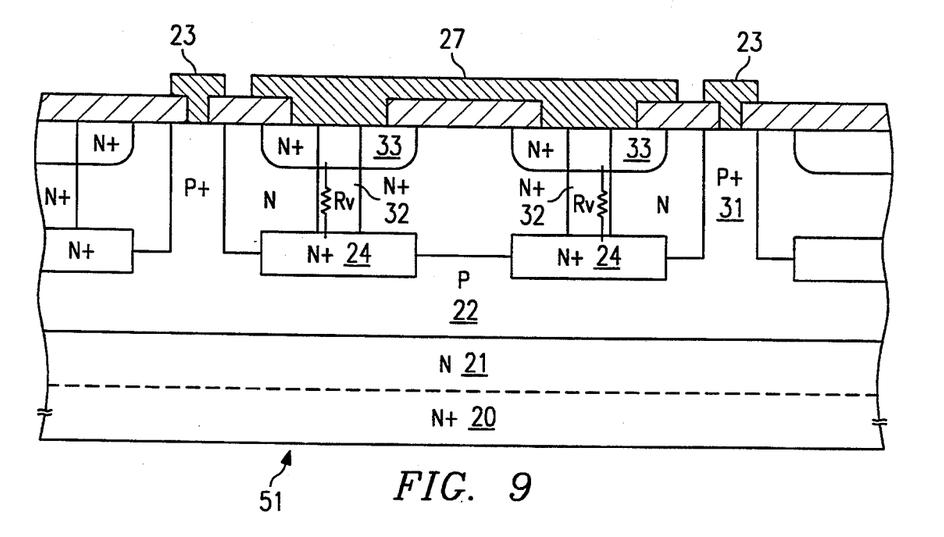
FIG. 9 is a vertical cross-section of another embodiment of the hollow emitter power transistor according to the invention.

As illustrated in FIG. 9, in this case each of the emitter regions 24 of one finger is connected through a connection area 32 to the corresponding metallization 27. Instead of the connection region 28, contact regions 33 of the type N+ are provided for with a length such as to allow a sufficiently wide opening of emitter contact.

In the case of FIG. 9 there is also a parallel resistance, constituting a ballast resistance Rv, which starting from the metallization 27 corresponding to the pair of emitter regions 24 of one finger crosses the connection area 32 vertically until it reaches the central area of the corresponding emitter region 24.

The functional considerations and conclusions already illustrated previously with reference to the prior embodiments of the invention are still valid.

Figure 10:
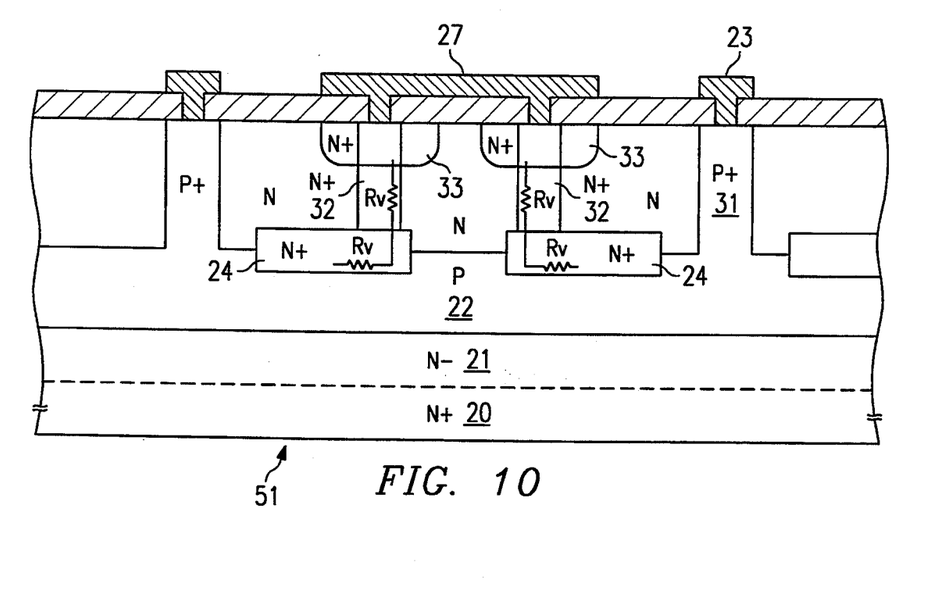
FIG. 10 is a vertical cross-section of a variant of the embodiment of FIG. 9 of the hollow emitter power transistor.

A functional improvement of the embodiment of the invention of FIG. 9 is illustrated in FIG. 10. This variant provides for the displacement of the connection areas 32 of the emitter regions 24 of a finger in the proximity of the internal extremities of the regions 24 with respect to the vertical connection regions 31 of the base region 22.

The emitter regions 24 of each finger are not activated in a uniform manner. For each of them the maximum activation takes place in the peripheral area next to the vertical region 31 from which the base current is flowing. With the progressive displacement away from the region 31 the base current meets a base pinch resistance of the region lying under the emitter region 24, due precisely to the pinching of the base region 22 caused by the diffusion of the type N+ corresponding to the emitter region 24. This causes a progressive debiasing of the emitter region 24 which de-biases until it becomes a purely resistive region which makes no contribution to the increase of the power transistor's current rating. This purely resistive region combines advantageously with the corresponding connection area 32 contributing to the formation of the emitter's ballast resistance Rv.

Figure 11:
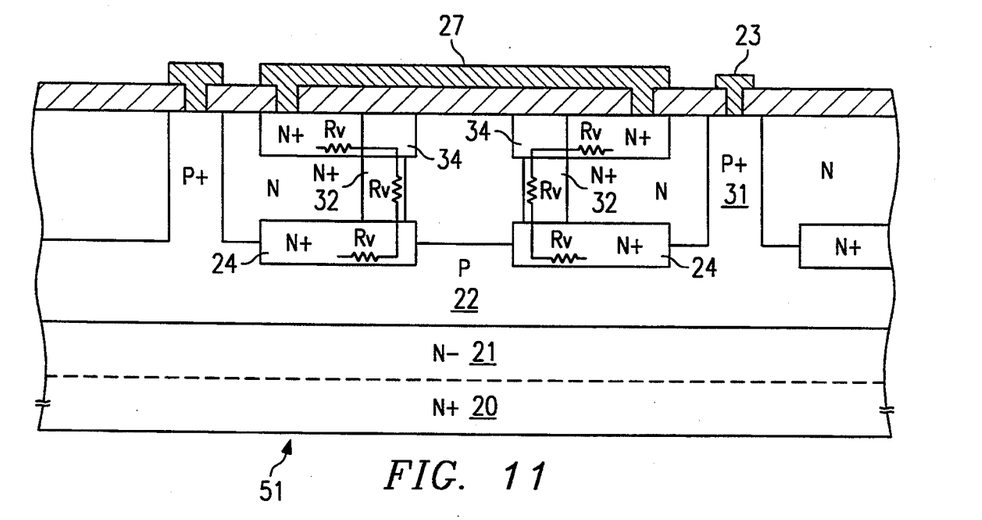
FIG. 11 is a vertical cross-section of a further variant of the embodiment of FIG. 9 of the hollow emitter power transistor.

A further increase in the ballast resistance Rv may be obtained with the embodiment of the hollow emitter power transistor illustrated in FIG. 11. This differs from that of FIG. 10 due to the presence of contact regions 34 which extend parallel to the surface of the chip 51 up to the proximity of the vertical regions 31 to be then contacted by the emitter metallization 27.

In this way a resistive parallel is created, constituting a ballast resistance Rv, which starting from the metallization 27 corresponding to the pair of emitter regions 24 of a finger runs parallel to the surface of the chip 51 along the horizontal resistive region 34 and then in depth along the corresponding vertical connection area 32 until it reaches a portion of the biased emitter region 24, and thus made purely resistive, due to the effect of the pinch resistance of the base region 22 lying below the region 24 according to the above description with reference to FIG. 10.

Figure 12:
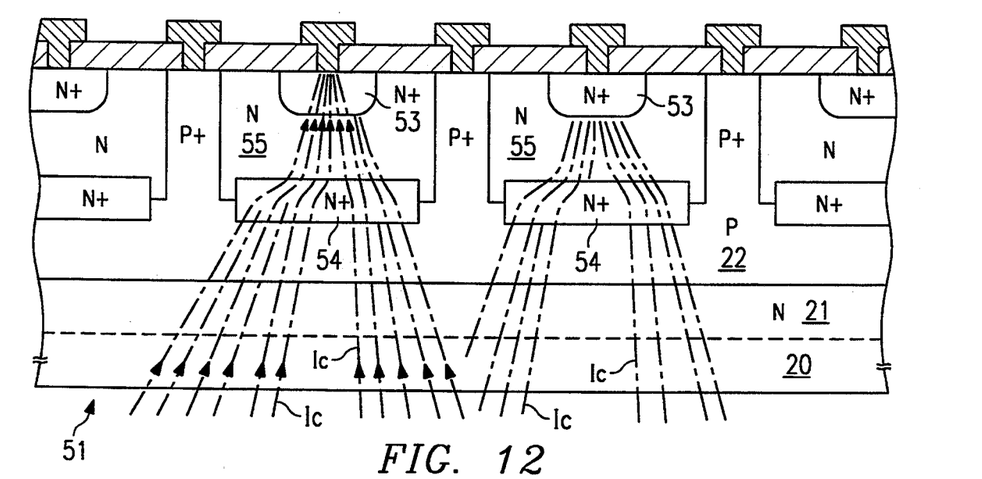
FIG. 12 is a vertical cross-section of a further embodiment of the power transistor according to the invention.

If it is desired to increase the value of the ballast resistances while leaving the emitter finger very narrow (some 50 microns) and if the layer 32 of FIG. 9 is not sufficiently resistive, in the sense that the associated ballast resistance is too small, it is possible to make recourse to the structure of FIG. 12. In this case the ballast resistance between each emitter 54 and a contact region 53 is provided by a second epitaxial layer 55 with a doping suitable to the amount of ballast due. In FIG. 12 there is also shown and indicated with Ic the flow of collector current of the power transistor, distributed over the different emitters 24.

Thus, the disclosed inventions are particularly advantageous in high-voltage high-current devices, with voltage ratings of up to 1000 V or more.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, it is not necessary to follow the specific layout shown in the plan view of FIG. 4. Alternatively, the emitter fingers can be branched, or multiple metallization layers can be used to alternate base contact and emitter contact regions in a checkerboard or other two-dimensional array. Moreover, the deep emitter regions 6 can also be patterned in other ways, e.g. by segmenting them along the length of the emitter contact finger, or in other ways.

While the numerous embodiments described have given some picture of the possible modifications and variations to the device structures, this does not nearly exhaust the scope of available modifications and variations to the various device structures described. For example, the disclosed innovations could also be used in a structure where an N+ deep-buried-layer (below the first epitaxial layer) was used below the power devices, to reduce the on-state series resistance.

For another example, the disclosed innovations can alternatively (but less preferably) be implemented in a heteroepitaxial structure (such as a Si/SiGe structure).

The disclosed innovations could be used in a discrete power device, as well as in a smart-power device.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A monolithic semiconductor device, comprising:
   a monolithic body of semiconductor material having at least a first surface;
   a collector region, buried within said body beneath said first surface, said collector region having a high dopant concentration of a first conductivity type;
   a base region, buried within said body beneath said first surface and above said collector region, said base region having a predominant dopant concentration of a second conductivity type;
   one or more emitter regions, buried within said body beneath said first surface and above said base region, said emitter regions having a predominant dopant concentration of a first conductivity type;
   one or more emitter reach-up regions within said body, each abutting one or more of said emitter regions and extending thence toward said first surface, said emitter reach-up regions having a net dopant concentration, of a first conductivity type, which is lower than the dopant concentration of said emitter regions;
   one or more emitter contact regions within said body at said first surface thereof, each abutting one or more of said emitter reach-up regions and having a net dopant concentration, of a first conductivity type, which is higher than the dopant concentration of said emitter reach-up regions;
   an insulator film covering said surface of said body, and having apertures therein; and
   thin-film metallization connected to make contact, through said apertures of said insulator film, to said emitter contact regions; said metallization also being extended to provide a contact pad;
   wherein said emitter reach-up region has a graduated width, which varies with location such that the net resistance of said emitter reach-up region is maximal in locations where the resistance of said metallization from said emitter contact region to said contact pad is minimal, and the resistance of said emitter reach-up region is minimal in locations where the resistance of said metallization from said emitter contact region to said contact pad is maximal.

2. The monolithic semiconductor device of claim 1, wherein said first conductivity type is N-type.

3. The monolithic semiconductor device of claim 1, wherein said body consists essentially of silicon.

4. The monolithic semiconductor device of claim 1, wherein said insulator film consists essentially of silicon dioxide.

5. The monolithic semiconductor device of claim 1, further comprising base reach-up regions, abutting said base region and extending toward said first surface; said base reach-up regions having a net dopant concentration, of a second conductivity type, which is higher than the dopant concentration of said base regions.

6. The monolithic semiconductor device of claim 1, wherein said body further comprises a second surface, opposite to said first surface, and said collector region abuts said second surface.

7. A monolithic semiconductor device, comprising:
   a monolithic body of semiconductor material having at least a first surface;

a collector region, buried within said body beneath said first surface, said collector region having a high dopant concentration of a first conductivity type;

a base region, buried within said body beneath said first surface and above said collector region, said base region having a predominant dopant concentration of a second conductivity type;

one or more emitter regions, buried within said body beneath said first surface and above said base region, said emitter regions having a predominant dopant concentration of a first conductivity type;

one or more emitter reach-up regions within said body, each abutting one or more of said emitter regions and extending thence toward said first surface, said emitter reach-up regions having a net dopant concentration, of a first conductivity type, which is lower than the dopant concentration of said emitter regions;

one or more emitter contact regions within said body at said first surface thereof, each abutting one or more of said emitter reach-up regions and having a net dopant concentration, of a first conductivity type, which is higher than the dopant concentration of said emitter reach-up regions;

an insulator film covering said surface of said body, and having apertures therein; and thin-film metallization connected to make contact, through said apertures of said insulator film, to said emitter contact regions; said metallization also being extended to provide a contact pad;

wherein said emitter, said emitter reach-up region, and said emitter contact region form an emitter structure which has a net resistance which is maximal in locations where the resistance of said metallization from said emitter contact region to said contact pad is minimal, and is minimal in locations where the resistance of said metallization from said emitter contact region to said contact pad is maximal.

8. The monolithic semiconductor device of claim 7, wherein said first conductivity type is N-type.

9. The monolithic semiconductor device of claim 7, wherein said body consists essentially of silicon.

10. The monolithic semiconductor device of claim 7, wherein said insulator film consists essentially of silicon dioxide.

11. The monolithic semiconductor device of claim 7, further comprising base reach-up regions, abutting said base region and extending toward said first surface; said base reach-up regions having a net dopant concentration, of a second conductivity type, which is higher than the dopant concentration of said base regions.

12. The monolithic semiconductor device of claim 7, wherein said body further comprises a second surface, opposite to said first surface, and said collector region abuts said second surface.

13. A monolithic semiconductor device, comprising:
a monolithic body of semiconductor material having at least a first surface;
a collector region, buried within said body beneath said first surface, said collector region having a high dopant concentration of a first conductivity type;
a base region, buried within said body beneath said first surface and above said collector region, said base region having a predominant dopant concentration of a second conductivity type;
one or more emitter regions, buried within said body beneath said first surface and above said base region, said emitter regions having a predominant dopant concentration of a first conductivity type;
one or more emitter reach-up regions within said body, each abutting one or more of said emitter regions and extending thence toward said first surface, said emitter reach-up regions having a net dopant concentration, of a first conductivity type, which is lower than the dopant concentration of said emitter regions;
one or more emitter contact regions within said body at said first surface thereof, each abutting one or more of said emitter reach-up regions and having a net dopant concentration, of a first conductivity type, which is higher than the dopant concentration of said emitter reach-up regions;
an insulator film covering said surface of said body, and having apertures therein; and
thin-film metallization connected to make contact, through said apertures of said insulator film, to said emitter contact regions; said metallization also being extended to provide a contact pad;
wherein said emitter contact region has a net resistance which is maximal in locations where the resistance of said metallization from said emitter contact region to said contact pad is minimal, and is minimal in locations where the resistance of said metallization from said emitter contact region to said contact pad is maximal.

14. The monolithic semiconductor device of claim 13, wherein said first conductivity type is N-type.

15. The monolithic semiconductor device of claim 13, wherein said body consists essentially of silicon.

16. The monolithic semiconductor device of claim 13, wherein said insulator film consists essentially of silicon dioxide.

17. The monolithic semiconductor device of claim 13, further comprising base reach-up regions, abutting said base region and extending toward said first surface; said base reach-up regions having a net dopant concentration, of a second conductivity type, which is higher than the dopant concentration of said base regions.

18. The monolithic semiconductor device of claim 13, wherein said body further comprises a second surface, opposite to said first surface, and said collector region abuts said second surface.

19. A monolithic semiconductor device having a vertical structure with a deep-base and finger-emitter power transistor, comprising:
a substrate of a first conductivity type suitable for operating as the collector of the power transistor,
an epitaxial layer of said first conductivity type superimposed over said substrate,
a base region of a second conductivity type formed in said epitaxial layer,
at least one first-conductivity-type buried emitter region in said base region for each emitter finger, each said emitter region being provided with at least one connection area between it and an emitter surface metallization, and
an emitter contact connected to the emitter surface metallization of all the fingers,
wherein each said connection area is made of a width such as to provide a ballast resistance of an adequate value to compensate for variation in the resistance of said emitter contact between said respective buried emitter region and the corresponding emitter surface metallization.

20. The device of claim 19, comprising at least one said buried emitter region for each emitter finger, said emitter region being provided with a pair of said connection areas between it and the emitter surface metallization, said pair of connection areas being connected along the surface of a horizontal connection area with the function of ballast resistance, which is wider than a known minimum emitter contact width.

21. The device of claim 19, comprising at least one said buried emitter region for each emitter finger, said emitter region being provided with a connection area between it and the emitter surface metallization, between said connection area and the corresponding surface metallization there being interposed a contact region having a width wider than a known minimum emitter contact width.

22. The device of claim 19, further comprising a pair of said buried emitter regions for each emitter finger, said pair of emitter regions being provided with a pair of connection areas between them and the emitter surface metallization, said pair of connection areas being connected along the surface by a horizontal connection area with the function of ballast resistance, which is wider than a known minimum emitter contact width.

23. The device of claim 19, further comprising a pair of said buried emitter regions for each said emitter finger, said pair of emitter regions being provided with respective connection areas between them and the emitter surface metallization, between each connection area and the corresponding surface metallization there being interposed a contact region which is wider than a known minimum emitter contact width.

24. The device of claim 19, wherein said at least one connection area is made with a width that is constant in a direction parallel to the surface of the monolithic device between the extremity of each emitter finger and the contact.

25. The device of claim 19, wherein said at least one connection area is made with a width that decreases in a direction parallel to the surface of the monolithic device between the extremity of each emitter finger and the contact.

26. The device of claim 19, wherein said connection region is constituted by a second epitaxial layer superimposed over, and of the same conductivity type as, said first epitaxial layer.

27. The device of claim 23, wherein said connection areas are positioned near the portions of the emitter regions which are closest to each other.

28. The device of claim 23, wherein a pair of contact regions with the function of ballast resistance are interposed between said pair of connection areas, said ballasting contact regions extending, parallel to the surface of the monolithic device, from said corresponding surface metallization up to the proximity of vertical connection regions which connect the base region with the surface of the monolithic device.

* * * * *